US012700656B2

(12) United States Patent
Oh et al.

(10) Patent No.: US 12,700,656 B2
(45) Date of Patent: Aug. 4, 2026

(54) COUPLER HAVING PORT LINES

(71) Applicant: AMOTECH CO., LTD., Incheon (KR)

(72) Inventors: Junseok Oh, Incheon (KR); Byungguk Lim, Incheon (KR)

(73) Assignee: AMOTECH CO., LTD., Incheon (KR)

( * ) Notice: Subject to any disclaimer, the term of this patent is extended or adjusted under 35 U.S.C. 154(b) by 180 days.

(21) Appl. No.: 18/715,078

(22) PCT Filed: Nov. 30, 2022

(86) PCT No.: PCT/KR2022/019275
§ 371 (c)(1),
(2) Date: May 30, 2024

(87) PCT Pub. No.: WO2023/101446
PCT Pub. Date: Jun. 8, 2023

(65) Prior Publication Data
US 2025/0038392 A1     Jan. 30, 2025

(30) Foreign Application Priority Data

Nov. 30, 2021     (KR) ........................ 10-2021-0168287

(51) Int. Cl.
*H01P 5/18*     (2006.01)
*H03H 1/00*     (2006.01)
(52) U.S. Cl.
CPC ..... *H01P 5/184* (2013.01); *H03H 2001/0085* (2013.01)
(58) Field of Classification Search
CPC ........ H01P 5/184; H01P 1/20345; H01P 5/04; H01P 5/08; H01P 5/18; H01P 5/187; H01P 5/19; H01P 1/181; H01P 1/184;
H01P 1/32; H01P 5/185; H01P 5/181; H01P 1/387; H01P 3/08; H01P 3/088; H01P 3/121; H01P 5/10; H01P 5/107; H01P 1/10; H01P 1/20; H01P 1/2039; H01P 1/2084; H01P 1/2088; H01P 1/2135; H01P 7/06; H01P 5/16; H03H 2001/0085
See application file for complete search history.

(56) References Cited

U.S. PATENT DOCUMENTS 6,753,745 B2 * 6/2004 Killen ..................... H01P 5/227
333/117
2018/0006353 A1 * 1/2018 Chueh .................... H01P 5/227

FOREIGN PATENT DOCUMENTS

KR     10-2003-0048845 A     6/2003
KR           20-0314925 Y1     6/2003
(Continued)

OTHER PUBLICATIONS

KR Office Action dated Jan. 19, 2024 as received in Application No. 10-2021-0168287.

*Primary Examiner* — John W Poos
(74) *Attorney, Agent, or Firm* — Maschoff Brennan

(57) ABSTRACT

The present invention relates to a coupler, which includes: a coupler body having an external ground formed on an outer surface thereof; a coupler line positioned inside the coupler body and electrically connected to a port electrode for signal connection with the outside; an internal ground arranged between the external ground and the coupler line and electrically connected to the external ground; and a port line having one end electrically connected to the port electrode and the other end electrically connected to the coupler line.

11 Claims, 8 Drawing Sheets

(56)        References Cited

FOREIGN PATENT DOCUMENTS

| KR | 10-0556622 | B1 | 3/2006 | |
| KR | 10-2009-0072461 | A | 7/2009 | |
| KR | 10-1310745 | B1 | 9/2013 | |
| KR | 10-2020-0022738 | A | 3/2020 | |
| WO | WO-2021042249 | A1 * | 3/2021 | ............... H01P 5/16 |

* cited by examiner

[FIG. 1]
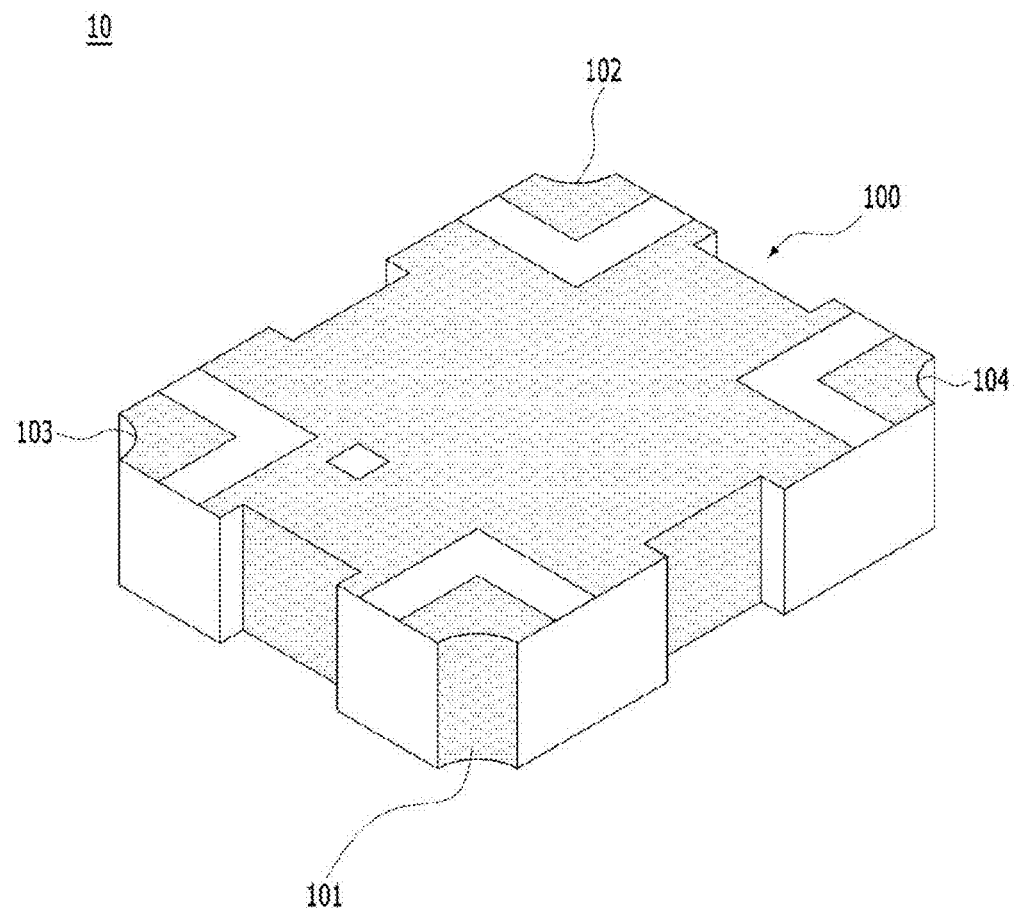

[FIG. 2]
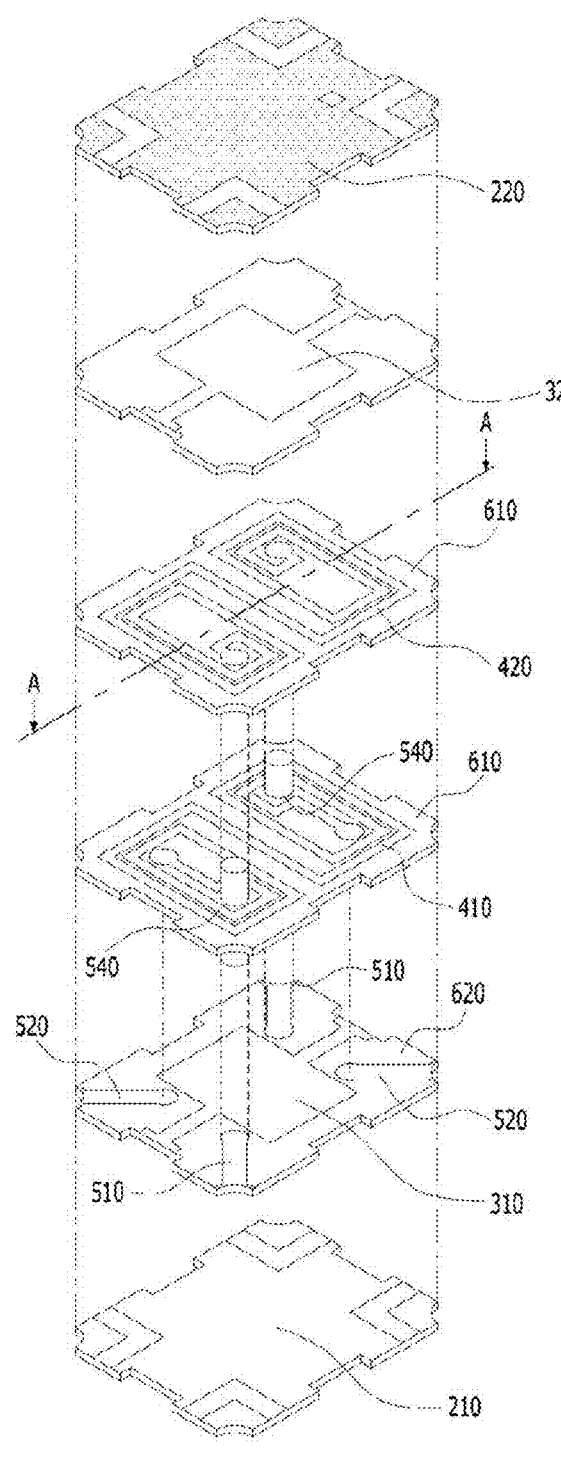

[FIG. 3]
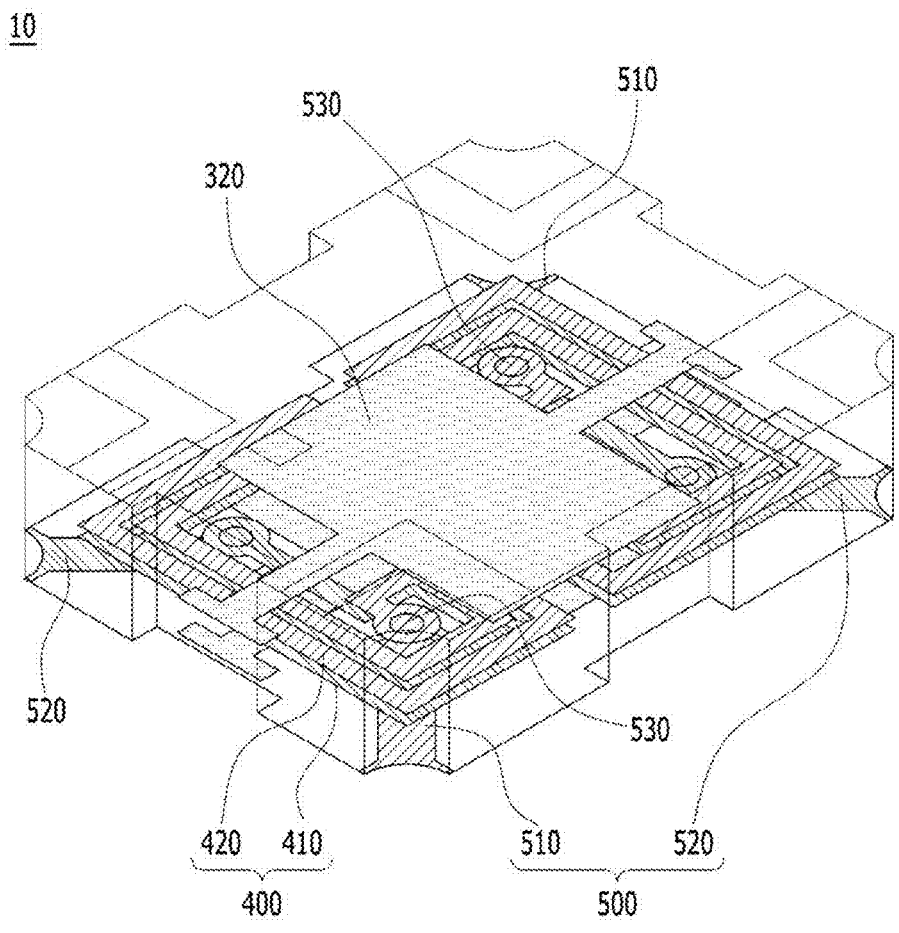

[FIG. 4]
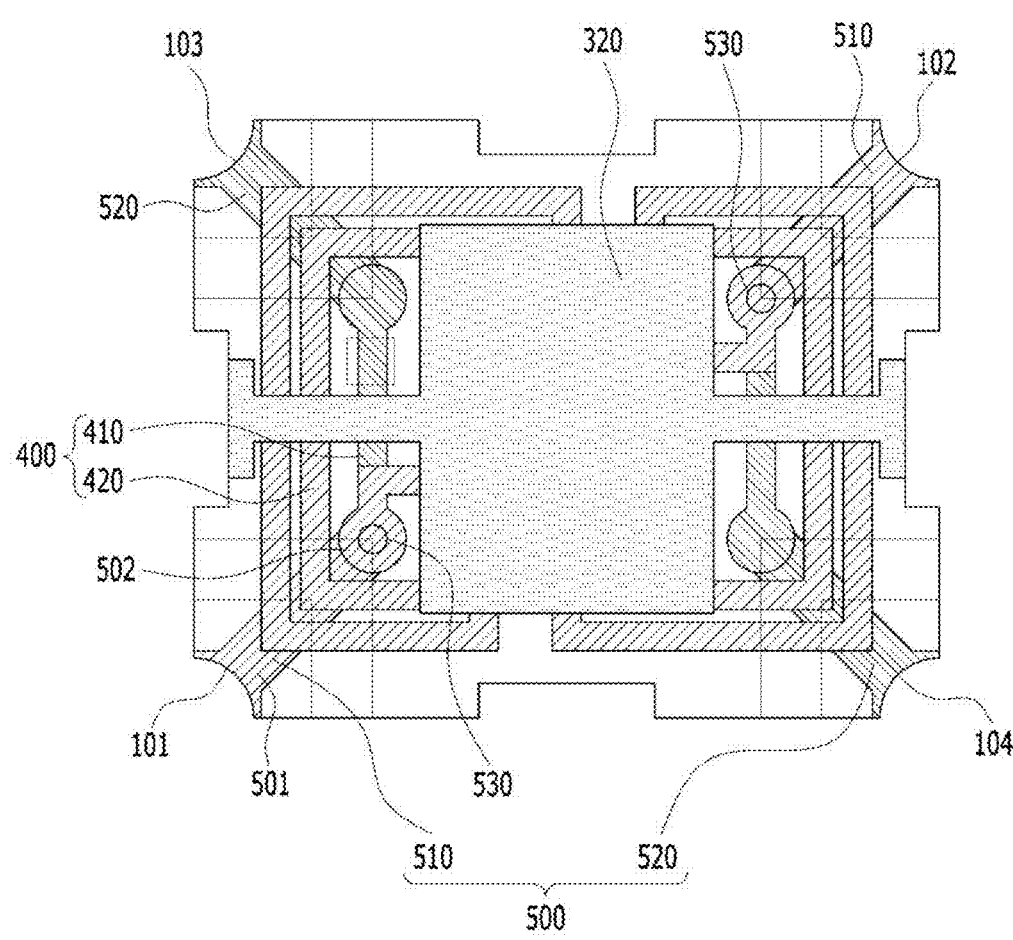

[FIG. 5]
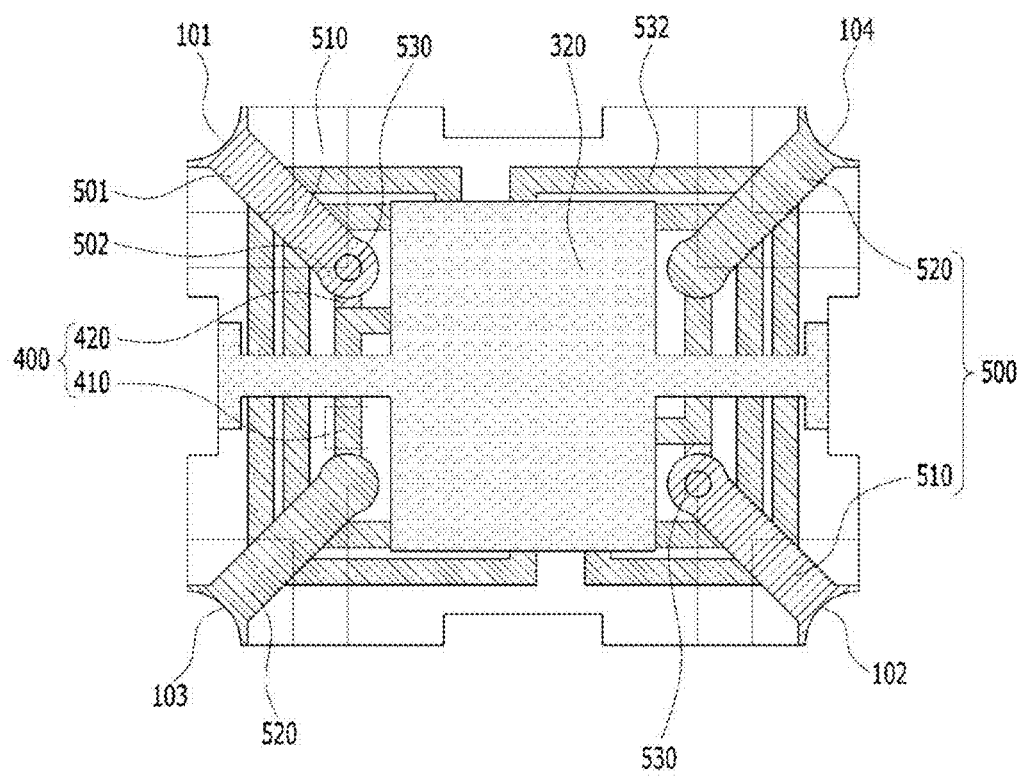

[FIG. 6]
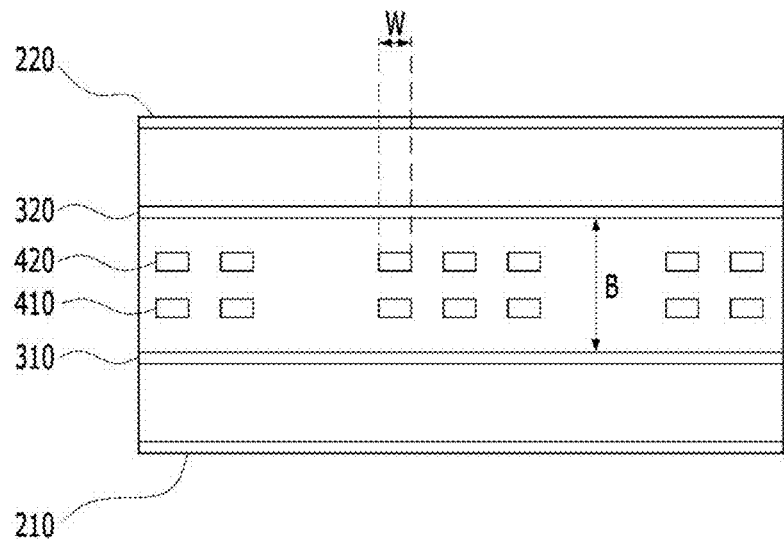

[FIG. 7]
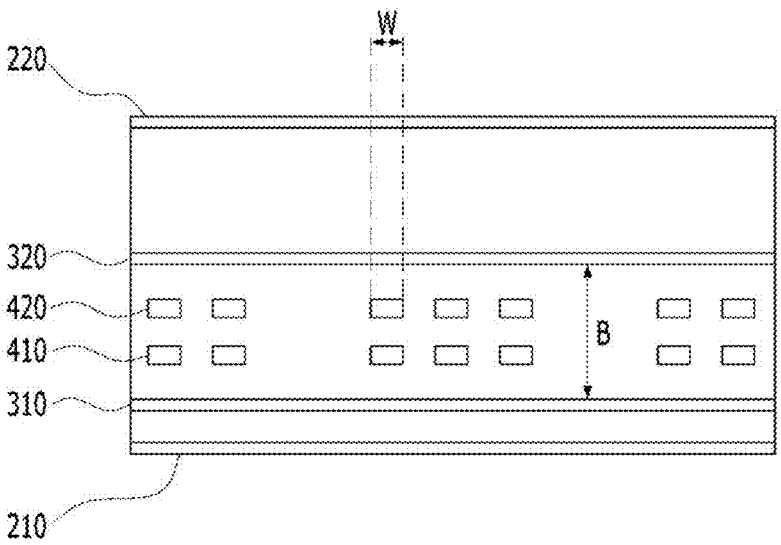
[FIG. 8]
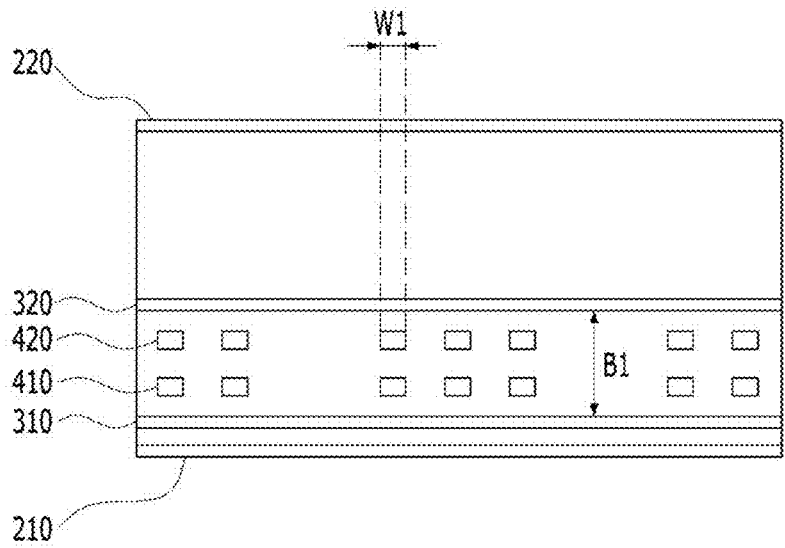

[FIG. 9]
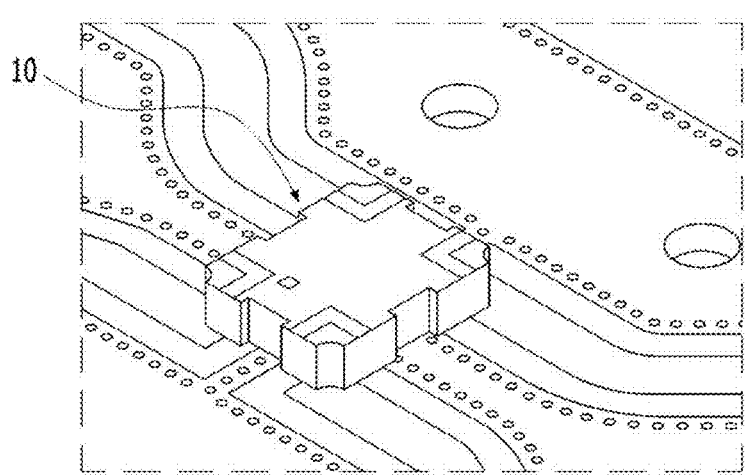

COUPLER HAVING PORT LINES

TECHNICAL FIELD

The present disclosure relates to a coupler, and more particularly, to a coupler that can be applied to various frequency bands.

BACKGROUND ART

At a radiofrequency, since a coupling phenomenon in which an energy amount of electromagnetic waves that leaks from a line itself increases becomes greater, a circuit structure is made by using such a coupling phenomenon at the radiofrequency (RF), and it is collectively called a coupler.

The coupler may be used for the purpose of distributing one signal into two or more specific signals or extracting a part of a power from the specific signal.

As the coupler, a directional coupler is a device that is mainly used for monitoring a signal in a mobile communication system, and is used to determine whether the communication system operates normally through measurement of the strength of a transmitted or received signal.

The directional coupler is provided with a first line on which a signal flows and a second line on which a signal is generated by coupling, and determines whether a proper signal is transmitted or received by detecting the signal that is generated through coupling on the second line.

In the directional coupler in the related art, if an input signal is applied to an input connector, a signal is output through an output connector via the first line.

The second line is spaced apart for a predetermined distance from the first line, and a part of the signal that is applied to the first line is coupled to the second line. The amount of coupling from the first line to the second line is determined by a coupling coefficient of the first line and the second line, and the coupling coefficient is determined by permittivity and a distance between two lines.

In the related art, two coupler lines are provided between grounds in a symmetric structure, and the related art has the problem in that as the distance between the lower ground and the coupler line gets away from each other, the signal transfer efficiency decreases.

The matters described in the above background technology are to help understanding of the background of the present disclosure, and may include the matters that are not the disclosed related art.

SUMMARY OF INVENTION

Technical Problem

One object of the present disclosure is to provide a coupler which can improve the signal transfer efficiency and the coupler characteristic by freely adjusting a location of a coupler line inside a ground.

The problems to be solved by the present disclosure are not limited to the above-mentioned problems, and other unmentioned problems will be able to be clearly understood by those of ordinary skill in the art from the following description.

Solution to Problem

In order to achieve the above object, a coupler according to an embodiment of the present disclosure includes: a coupler body having an external ground formed on an outer surface thereof; a coupler line located inside the coupler body and electrically connected to a port electrode for signal connection with an outside; an internal ground disposed between the external ground and the coupler line and electrically connected to the external ground; and a port line having one end electrically connected to the port electrode and the other end electrically connected to the coupler line.

Further, a pair of internal grounds may be provided inside the coupler body, and the coupler line may be disposed between the pair of internal grounds.

Further, the coupler line may be disposed between the external ground formed on a lower surface of the coupler body and the internal ground.

Further, the external ground may include: a first external ground configuring a lower surface of the coupler body; and a second external ground configuring an upper surface of the coupler body, and the internal ground may include: a first internal ground disposed between the first external ground and the second external ground; and a second internal ground disposed between the first external ground and the second external ground and disposed to be spaced apart at a first interval from the first internal ground.

Further, the coupler line may be disposed between the first internal ground and the second internal ground.

Further, the internal ground may have a center part formed in a rectangular shape and both sides facing each other and formed to extend toward an outside.

Further, the internal ground may be electrically connected to the external ground through an outer surface of the coupler body.

Further, the coupler line may have one side formed in a spiral shape and the other side formed in a spiral shape, and the one side and the other side may be connected to each other.

Further, the internal ground may be formed to overlap a location where one side and the other side of the coupler line are connected to each other.

Further, the coupler line may include: a first coupler line electrically connected to the port line; and a second coupler line disposed to be spaced apart from the first coupler line.

Further, a spiral shape formed on one side of the first coupler line and a spiral shape formed on one side of the second coupler line may be disposed at a location where the spiral shapes overlap each other, and a spiral shape formed on the other side of the first coupler line and a spiral shape formed on the other side of the second coupler line may be disposed at a location where the spiral shapes overlap each other.

Further, an interval between the first internal ground and the first external ground may be narrower than an interval between the second internal ground and the second external ground.

Further, four corners of the coupler body may be formed to be curved toward an inside, and the port electrode may be disposed at each of the corners.

Further, the port line may include: a first port line electrically connected to the first coupler line; and a second port line electrically connected to the second coupler line.

Further, the first port line may be disposed on both sides of a diagonal that connects a first surface and a second surface of the coupler body to each other, and the second port line may be disposed on both sides of a diagonal that connects a third surface and a fourth surface of the coupler body.

Further, the coupler body may further include a via that electrically connects the other end of the port line and the coupler line to each other.

Further, the coupler body may include a plurality of sheets stacked inside the coupler body, and the sheets may include a coupler sheet provided with the coupler line; and a port sheet provided with the port line.

Advantageous Effects of Invention

The present disclosure may have the following effects.

First, the present disclosure is provided with the internal ground inside the coupler body separately from the external ground. By reducing the interval between the first internal ground and the second internal ground, the width of the coupler line can be reduced, and thus the pattern of the coupler line can be variously changed, and the product of various frequency bands can be designed.

Further, the internal ground may be disposed in the center of the coupler body, or may be disposed close to the lower side of the coupler body.

Due to this, the parasitic component of the signal can be reduced through reduction of an inductor (L) component of the characteristic impedance, and the signal transfer efficiency can be improved through reduction of the signal delay.

Further, by adjusting the size of the internal ground, it is possible to finely adjust the impedance value.

The effects of the present disclosure are not limited to the above-mentioned effects, and other unmentioned effects will be able to be clearly understood by those of ordinary skill in the art from the following description.

BRIEF DESCRIPTION OF DRAWINGS

FIG. 1 is a usage status view of a coupler according to an embodiment of the present disclosure.

FIG. 2 is a perspective view illustrating a coupler according to an embodiment of the present disclosure.

FIG. 3 is an exploded perspective view of a coupler illustrated in FIG. 2.

FIG. 4 is a projection top view of a coupler illustrated in FIG. 2.

FIG. 5 is a projection bottom view of a coupler illustrated in FIG. 2.

FIG. 6 is a cross-sectional view of a coupler illustrated in FIG. 2 cut along line A-A of FIG. 2.

FIG. 7 is a projection perspective view of a coupler according to another embodiment of the present disclosure.

FIG. 8 is a cross-sectional view of a coupler illustrated in FIG. 7.

FIG. 9 is a cross-sectional view of a coupler according to still another embodiment of the present disclosure.

DESCRIPTION OF EMBODIMENTS

The aspects and features of the present disclosure and methods for achieving the aspects and features will be apparent by referring to the embodiments to be described in detail with reference to the accompanying drawings. However, the present disclosure is not limited to the embodiments disclosed hereinafter, and it can be implemented in various different forms. However, the embodiments are provided to complete the present disclosure and to assist those of ordinary skill in the art in a comprehensive understanding of the scope of the technical idea, and the disclosure is only defined by the scope of the appended claims.

Terms used in the description are to explain specific embodiments, but are not intended to limit the present disclosure. Further, in the description, unless specially described on the contrary in context, a singular form may include a plural form.

In the description, the term "comprises" and/or "comprising" should be interpreted as not excluding the presence or addition of one or more other constituent elements in addition to the mentioned constituent elements.

The term "and/or" used in the description includes each of the mentioned constituent elements and all combinations of one or more thereof. Although the terms "first", "second", and so forth are used to describe various constituent elements, these constituent elements should not be limited by the terms. The above-described terms are used only for the purpose of discriminating one constituent element from another constituent element. Accordingly, a first constituent element to be mentioned hereinafter may be a second constituent element in the technical idea of the present disclosure.

The term "horizontal direction" used in the following description means a forward, rearward, left, or right direction in a state where a location in an upward or downward direction is not changed, and the term "vertical direction" used in the following description means an upward or downward direction in a state where a location in a forward, rearward, left, or right direction is not changed.

In describing the embodiments, in case that each layer (film), area, pattern, or structure is described to be formed "on" or "under" each substrate, layer (film), area, pad, or pattern, the terms "on" and "under" include both "direct" and "indirect" forming. Further, the criterion of "on" or "under" each layer is principally based on the drawings.

The drawings are merely to understand the idea of the present disclosure, and it should not be interpreted that the scope of the present disclosure is not limited by the drawings. Further, in the drawings, a relative thickness, length, or size may be exaggerated for convenience and clarity of the description, and throughout the description, the same reference numerals refer to the same constituent elements.

Hereinafter, embodiments of the present disclosure will be described in detail with reference to the accompanying drawings.

FIG. 1 is a usage status view of a coupler 10 according to an embodiment of the present disclosure.

Referring to FIG. 1, a coupler 10 is provided on a circuit board.

The coupler 10 provided on the circuit board may play a role of signal transfer and distribution.

FIG. 2 is a perspective view illustrating a coupler 10 according to an embodiment of the present disclosure.

Referring to FIG. 2, the coupler 10 according to an embodiment of the present disclosure includes a coupler body 100.

The coupler body 100 forms the outside of the coupler 10. In the illustrated embodiment, the coupler body 100 has corners in a height direction which are in a cuboidal shape curved toward an inside.

In this case, surfaces formed by the corners in a height direction which are curved toward the inside are defined as a first surface 101, a second surface 102, a third surface 103, and a fourth surface 104.

On each of the first surface 101, the second surface 102, the third surface 103, and the fourth surface 104, a port electrode is disposed, and the details thereof will be described later.

The coupler body 100 is provided with a port electrode for signal connection to an external ground 200 to be described later and an outside.

FIG. 3 is an exploded perspective view of a coupler 10 illustrated in FIG. 2.

Referring to FIGS. 2 and 3, the coupler body 100 may be formed through combination of a plurality of sheets 600, and may be formed in a ceramic process. The ceramic process means a general process in which a material in which ceramics and the like are mixed is made into a thin paper-like sheet 600, which is then cut into several sheets, a metal conductor is formed on the respective sheets 600 so as to suit the role of an electrode or an element, and then the ceramics and the metal are baked and formed at the same time through adaptation of the respective sheets depending on the form to be constituted.

The sheet 600 includes a coupler sheet 610 and a port sheet 620. Although not illustrated, the sheet may also include a ground sheet including the ground. Further, among the ground sheet, the coupler sheet 610, and the port sheet 620, a dummy sheet (not illustrated) may be provided.

The coupler sheet 610 is provided with a coupler line 600, and the port sheet 510 is provided with a port line 500. The details of the coupler line 600 and the port line 500 will be described later.

The coupler body 100 further includes an external ground 200, an internal ground 300, a coupler line 400, and a port line 500.

The coupler corresponding to the related art is formed in a symmetric structure in which a pair of coupler lines are put in the middle between a pair of grounds, and a dielectric material is filled between the pair of grounds. In case that the pair of coupler lines are not symmetrically formed based on a virtual center line between the pair of grounds, but are located to be concentrated on one of the pair of grounds, there is a problem in that the coupler operates inconsistently with its original purpose. In order to solve this, the coupler 100 according to the illustrated embodiment may have the internal ground 300 inserted between the pair of external grounds 200.

The external ground 200 is formed on an outer surface of the coupler body 100.

A pair of external grounds 200 may be formed. In this case, the pair of external grounds 200 may form an upper surface and a lower surface of the coupler body 100.

The external ground 200 includes a first external ground 210 and a second external ground 220. In this case, the first external ground 210 constitutes one surface of the coupler body 100, and the second external ground 220 constitutes the other surface of the coupler body 100. In this case, the one surface may be the lower surface of the coupler body 100, and the other surface may be the upper surface of the coupler body 100.

The internal ground 300 is disposed inside the coupler body 100. A pair of internal grounds 300 may be provided, and the coupler line 400 to be described later may be disposed between the pair of internal grounds 300.

The internal ground 300 includes a first internal ground 310 and a second internal ground 320. The first internal ground 310 and the second internal ground 320 may be disposed to be inserted between the first external ground 210 and the second external ground 220.

The first internal ground 310 and the second internal ground 320 are disposed to be spaced apart from each other at a predetermined interval.

The first internal ground 310 is located close to the first external ground 210, and the second internal ground 320 is disposed close to the second external ground 220.

That is, from the lower surface of the coupler body 100 to the upper surface thereof, a structure may be formed, in which the first external ground 210, the first internal ground 310, the second internal ground 320, and the second external ground 220 are stacked in order.

The coupler line 400 may be disposed between the pair of internal grounds 400 located inside the coupler body 100.

In the illustrated embodiment, the coupler line 400 is disposed between the first internal ground 310 and the second internal ground 320.

Further, although not illustrated, the coupler line 400 may have one side formed in a spiral shape and the other side formed in a spiral shape, and the one side and the other side may be provided to be connected to each other.

In this case, the one side means a side surface close to the first surface 101 and the third surface 103 illustrated in FIG. 2, and the other side means a side surface close to the second surface 102 and the fourth surface 104 illustrated in FIG. 2.

The spiral center in the spiral shape on the one side of the coupler line 400 may not be located in the very center, but may be located close to the first surface 101 illustrated in FIG. 1. Further, the spiral center in the spiral shape on the other side of the coupler line 400 may not be located in the very center, but may be located close to the second surface 102 illustrated in FIG. 1. However, the center of each spiral is not limited to the illustrated location.

Meanwhile, the illustrated spiral shape of the coupler line 400 is merely one embodiment, and the coupler line 400 may be formed in a twisty meander shape. That is, the size and the location of the coupler line 400 may be changed in consideration of the characteristic of the coupler 10, or the locations and the shapes of the port line 500 and the internal ground 300.

The coupler line 400 includes a first coupler line 410 and a second coupler line 420 for coupling.

The first coupler line 410 is electrically connected to the port line 500 to be described later, and a signal is input thereto.

The second coupler line 420 is disposed to be spaced apart from the first coupler line 410, and a coupling signal flows from the first coupler line 410 to the second coupler line 420.

Further, the first coupler line 410 and the second coupler line 420 may be formed at a location where they overlap each other. Specifically, a spiral shape formed on one side of the first coupler line 410 and a spiral shape formed on one side of the second coupler line 420 may be disposed at a location where the spiral shapes overlap each other, and a spiral shape formed on the other side of the first coupler line 410 and a spiral shape formed on the other side of the second coupler line 420 may be disposed at a location where the spiral shapes overlap each other.

From the lower surface of the coupler body 100 to the upper surface thereof, a structure may be formed, in which the first external ground 210, the first internal ground 310, the first coupler line 410, the second coupler line 420, the second internal ground 320, and the second external ground 220 are stacked in order.

The port line 500 corresponds to a line on which signals flow in and out between the coupler 10 in the illustrated embodiment and the outside.

The port line 500 includes a first port line 510 and a second port line 520. The first port line 510 is electrically connected to the second coupler line 420, and the second port line 520 is electrically connected to the first coupler line 410.

For the electrical connection between the port line 500 and the coupler line 400, the coupler body 100 further includes a via 530.

Specifically, the via 530 electrically connects the first port line 510 and the second coupler line 420 to each other. For this, the coupler sheet 61 provided with the first coupler line 410 may be provided with a via hole 540 that is penetrated by the via 530.

It is preferable to understand the actual length in a height direction of the via 530 with reference to FIG. 7 to be described later. Specifically, the length in the height direction of the via 530 may be set to match an interval between the first port line 510 and the second coupler line 420.

The illustrated length in the height direction of the via 530 and the width of a cross section that is vertical to the height direction may be set to be smaller than those as illustrated.

The shape of the cross section that is vertical to the height and direction of the via 530 may be circular or polygonal.

FIG. 4 is a projection top view of a coupler 10 illustrated in FIG. 2. FIG. 5 is a projection bottom view of a coupler 10 illustrated in FIG. 2.

Referring to FIGS. 4 and 5, one end 501 of the port line is electrically connected to the port electrode, and the other end 502 of the port line is electrically connected to the coupler line 400.

The first port line 510 may be disposed close to the first surface 101 and the second surface 102 illustrated in FIG. 1. That is, the first port line 510 is disposed on both sides of a diagonal that connects the first surface 101 and the second surface 102 of the coupler body 100 to each other.

As described above, the first port line 510 is electrically connected to the second coupler line 420 through the via 530 that is located at one end 510 of the port line.

The second port line 520 may be disposed close to the third surface 103 and the fourth surface 104 illustrated in FIG. 1. That is, the second port line 520 is disposed on both sides of a diagonal that connects the third surface 103 and the fourth surface 104 of the coupler body 100 to each other.

Meanwhile, the port electrode may be located at one end 501 of the port line 500, and may be formed of a metal conductor. For example, the port electrode may be formed of gold, silver, copper, or lead.

Further, as described above, the coupler body 100 has the corners in the height direction which are formed to be curved toward the inside, and the port electrode may be disposed at each of the corners. Further, the port electrode may be disposed even on the side surface of the coupler body 100 that is not the first surface 101, the second surface 102, the third surface 103, and the fourth surface 104.

Although the port line 500 is disposed adjacent to the location where four corners are formed to be curved toward the inside, the disposition of the port line 500 is not limited thereto, and the location and the number of port lines 500 may be variously changed.

Meanwhile, in case that the internal ground 300 overlaps all of the coupler line 400, the impedance matching may not be smooth. Accordingly, for the impedance matching, when viewing the coupler body 100 in FIG. 4 or 5, it is preferable that the internal ground 300 is provided so as to form an area that partially overlaps the coupler line 400.

For this, in the illustrated embodiment, the center part of the internal ground 300 may be formed in a polygonal shape. Both sides, which face each other, of the center part of the internal ground 300 are formed to extend toward the outside. Further, in the illustrated embodiment, the internal ground 300 is formed so that the facing both sides of the cross section that is vertical to the height direction come in contact with the inner surface of the coupler body.

Further, the internal ground 300 is formed so that the cross section thereof that is vertical to the height direction overlaps the location where the one side and the other side of the coupler line 400 are connected.

However, the size and the shape of the internal ground 300 are not limited to the size and the shape as described above, and may differ depending on the shape and the line width and pattern of the coupler line 400.

By adjusting the size and the shape of the internal ground 300, the characteristic impedance value of the coupler 10 can be adjusted.

FIG. 6 is a cross-sectional view of a coupler 10 illustrated in FIG. 2 cut along line A-A of FIG. 2.

Referring to FIG. 6, as described above, a pair of internal grounds 300 are disposed in the center of the coupler body 100, and the coupler line is inserted between the pair of internal grounds 300, and is disposed in the center of the coupler body 100.

Specifically, it is preferable that the first coupler line 410 and the second coupler line 420 are disposed in a symmetric structure between the first internal ground 310 and the second internal ground 320. That is, the first coupler line 410 and the second coupler line 420 are disposed in a state where the distance from the first coupler line 410 to the first internal ground 310 is equal to the distance from the second coupler line 420 to the second internal ground 320.

The interval between the first internal ground 310 and the second internal ground 320 is defined as a first interval B, and the width of the coupler lines 410 and 420 is defined as a first line width W.

In this case, the characteristic impedance of the coupler 10 in the illustrated embodiment satisfies the following relational expression.

$$Z_0(\text{Characteristic impedance}) = (30\pi/(\varepsilon_r)^{0.5})*(B/(W_e + 0.441B))$$

($W_e$: Effective width of the line)

Referring to the relational expression, if the first interval B decreases in case that the characteristic impedance value of the coupler 10 is determined, it can be known that the first line width W should also decrease.

Specifically, unlike a case where only a pair of grounds are present in the coupler 10, in case of a structure in which a pair of internal grounds 300 are inserted into a pair of external grounds 200, the first line width W of the pair of coupler lines 400 can be reduced through reduction of the first interval B that is the distance between the pair of internal grounds 300.

That is, since the first line width W of the coupler line 400 can be freely changed by adjusting the interval between the first internal ground 310 and the second internal ground 320 regardless of the interval between the first external ground 210 and the second external ground 220, it may be possible to design the coupler 10 through which signals of various bands can flow in and out.

Accordingly, whereas the coupler in the related art is not provided with the internal ground, and thus there is a limit in reducing the first line width of the coupler line, resulting in that it is not easy to design the coupler that can absorb various bands, whereas the embodiment of the present disclosure can solve this.

FIG. 7 is a projection perspective view of a coupler 10 according to another embodiment of the present disclosure, and FIG. 8 is a cross-sectional view of a coupler 10 illustrated in FIG. 7.

Referring to FIGS. 7 and 8, according to another embodiment of the present disclosure, the internal ground 300 may be disposed closer to the lower surface of the coupler body 100 as compared with the embodiment illustrated in FIG. 6.

That is, the first internal ground 310 may be disposed adjacent to the first external ground 210.

That is, the interval between the first internal ground 310 and the first external ground 210 may be set to be narrower than the interval between the second internal ground 320 and the second external ground 220.

The second internal ground 320 is disposed at a predetermined distance from the first internal ground 310 to correspond to the location of the first internal ground 310. Specifically, it may be located at a distance that is apart for the first interval B from the first internal ground 310.

In case that a signal flows into the coupler 10 according to the embodiment of the present disclosure illustrated in FIGS. 7 and 8, and passes through the coupler line 400, the length where the signal passes becomes shorter than that in case that the signal passes through the coupler line 400 in the embodiment illustrated in FIG. 6.

That is, the length of an inductor (L) component of the characteristic impedance of the coupler 10 according to the illustrated embodiment becomes shorter than the length of the inductor (L) component of the characteristic impedance of the coupler 10 according to the embodiment illustrated in FIG. 6. Due to this, the parasitic component of the signal can be reduced, and the signal delay can be reduced.

As described above, in case that the internal ground 300 is disposed close to the lower surface of the coupler body 100, the signal transfer efficiency can be improved.

Further, although not illustrated, the coupler line 400 may be disposed between the first external ground 210 and the first internal ground 310. In this case, the second internal ground 320 does not need to be an essential constituent element. That is, the coupler line 400 may be disposed between any two internal and external grounds regardless of the external ground 200 and the internal ground 300.

FIG. 9 is a cross-sectional view of a coupler according to still another embodiment of the present disclosure.

Referring to FIG. 9, in the coupler 10 according to still another embodiment as illustrated, the line width of the coupler line 400 is defined as a second line width W1, and an interval between the first internal ground 310 and the second internal ground 320 is defined as a second interval B1.

It can be known that the second line width W1 is smaller than the first line width W defined with reference to FIG. 6, and the second interval B1 is smaller than the first interval B defined with reference to FIG. 6. As described above, if the interval between the first internal ground and the second internal ground is adjusted, the interval between the first coupler line and the second coupler line can be adjusted, and thus it can be known that the pattern of the coupler line can be variously changed.

The above explanation of the present disclosure is merely for exemplary explanation of the technical idea of the present disclosure, and it can be understood by those of ordinary skill in the art to which the present disclosure pertains that various corrections and modifications thereof will be possible in a range that does not deviate from the essential characteristics of the present disclosure. Accordingly, it should be understood that the embodiments disclosed in the present disclosure are not to limit the technical idea of the present disclosure, but to explain the same, and thus the scope of the technical idea of the present disclosure is not limited by such embodiments. The scope of the present disclosure should be interpreted by the appended claims to be described later, and all technical ideas in the equivalent range should be interpreted as being included in the scope of the present disclosure.

INDUSTRIAL APPLICABILITY

The present disclosure relates to a coupler.

The invention claimed is:

1. A coupler comprising:

a coupler body having an external ground formed on an outer surface thereof;

a coupler line located inside the coupler body and electrically connected to a port electrode for signal connection with an outside source;

an internal ground disposed between the external ground and the coupler line and electrically connected to the external ground; and a port line having one end electrically connected to the port electrode and the other end electrically connected to the coupler line, wherein the external ground comprises:

a first external ground configuring a lower surface of the coupler body; and a second external ground configuring an upper surface of the coupler body, wherein the internal ground further includes:

a first internal ground disposed between the first external ground and the second external ground; and a second internal ground disposed between the first external ground and the second external ground and disposed to be spaced apart at a first interval from the first internal ground, wherein an interval between the first internal ground and the first external ground is narrower than an interval between the second internal ground and the second external ground.

2. The coupler of claim 1, wherein the coupler line is disposed between the external ground formed on a lower surface of the coupler body and the internal ground.

3. The coupler of claim 1, wherein the coupler line is disposed between the first internal ground and the second internal ground.

4. The coupler of claim 1, wherein the internal ground has a center part formed in a rectangular shape and both sides facing each other and formed to extend toward an outside.

5. The coupler of claim 1, wherein the internal ground is electrically connected to the external ground through an outer surface of the coupler body.

6. The coupler of claim 1, wherein the coupler line has one side formed in a spiral shape and the other side formed in a spiral shape, the one side and the other side being connected to each other.

7. A coupler comprising:

a coupler body having an external ground formed on an outer surface thereof;

a coupler line located inside the coupler body and electrically connected to a port electrode for signal connection with an outside source;

an internal ground disposed between the external ground and the coupler line and electrically connected to the external ground; and a port line having one end electrically connected to the port electrode and the other end electrically connected to the coupler line, wherein the coupler line comprises:

a first coupler line electrically connected to the port line; and a second coupler line disposed to be spaced apart from the first coupler line, wherein a spiral shape formed on one side of the first coupler line and a spiral shape formed on one side of the second coupler line are disposed at a location where the spiral shapes overlap each other, and wherein a spiral shape formed on the other side of the first coupler line and a spiral shape formed on the other side of the second coupler line are disposed at a location where the spiral shapes overlap each other.

8. The coupler of claim 1, wherein four corners of the coupler body are formed to be curved toward an inside, and wherein the port electrode is disposed at each of the corners.

9. A coupler comprising:

a coupler body having an external ground formed on an outer surface thereof;

a coupler line located inside the coupler body and electrically connected to a port electrode for signal connection with an outside source;

an internal ground disposed between the external ground and the coupler line and electrically connected to the external ground; and a port line having one end electrically connected to the port electrode and the other end electrically connected to the coupler line, wherein the internal ground is formed to overlap a location where one side and the other side of the coupler line are connected to each other, wherein the port line comprises:

a first port line electrically connected to the first coupler line; and a second port line electrically connected to the second coupler line, wherein the first port line is disposed on both sides of a diagonal that connects a first surface and a second surface of the coupler body to each other, and wherein the second port line is disposed on both sides of a diagonal that connects a third surface and a fourth surface of the coupler body.

10. The coupler of claim 1, wherein the coupler body further comprises a via that electrically connects the other end of the port line and the coupler line to each other.

11. The coupler of claim 1, wherein the coupler body comprises a plurality of sheets stacked inside the coupler body, and wherein the sheets include:

a coupler sheet provided with the coupler line; and a port sheet provided with the port line.

* * * * *